United States Patent
Cho

(10) Patent No.: US 12,045,105 B2
(45) Date of Patent: Jul. 23, 2024

(54) METHOD FOR PREDICTING AND MANAGING TEMPERATURE OF ELECTRONIC CIRCUIT

(71) Applicants: Huaxie Nan, Gyeonggi-do (KR); Young Chang Cho, Chungcheongbuk-do (KR)

(72) Inventor: Young Chang Cho, Chungcheongbuk-do (KR)

(73) Assignees: Young Chang Cho, Chungcheongbuk-Do (KR); Huaxie Nan, Gyeonggi-Do (KR); Paul H. Son, New Brunswick, NJ (US)

( * ) Notice: Subject to any disclaimer, the term of this patent is extended or adjusted under 35 U.S.C. 154(b) by 0 days.

(21) Appl. No.: 18/269,512

(22) PCT Filed: Apr. 21, 2021

(86) PCT No.: PCT/KR2021/005058
§ 371 (c)(1),
(2) Date: Jun. 23, 2023

(87) PCT Pub. No.: WO2022/154187
PCT Pub. Date: Jul. 21, 2022

(65) Prior Publication Data
US 2024/0045483 A1    Feb. 8, 2024

(30) Foreign Application Priority Data
Jan. 15, 2021  (KR) .......... 10-2021-0005736

(51) Int. Cl.
G06F 1/32    (2019.01)
G06F 1/20    (2006.01)
G06F 1/3296  (2019.01)

(52) U.S. Cl.
CPC .......... G06F 1/206 (2013.01); G06F 1/3296 (2013.01)

(58) Field of Classification Search
CPC .................... G06F 1/32; G06F 9/44
See application file for complete search history.

(56) References Cited

U.S. PATENT DOCUMENTS

| | | | |
|---|---|---|---|
| 2005/0289373 A1* | 12/2005 | Chapuis | H02J 1/08 713/300 |
| 2011/0164439 A1* | 7/2011 | Berton | H03K 7/08 363/21.09 |
| 2021/0281171 A1* | 9/2021 | Shlomo | G11C 5/145 |

FOREIGN PATENT DOCUMENTS

| | | |
|---|---|---|
| KR | 20160021960 | 2/2016 |
| KR | 101663532 | 10/2016 |

(Continued)

*Primary Examiner* — Keshab R Pandey
(74) *Attorney, Agent, or Firm* — IPLA P.A.

(57) ABSTRACT

Provided is a method for predicting and managing the temperature of an electronic circuit, which can trigger an alarm, block, or control by predicting in advance a temperature rise result due to heat before heat generation of the electronic circuit and components increases up to a risk level. The temperature prediction and management method is a method for predicting and managing the temperature of an electrical circuit unit including one or more circuits or components including: a detection unit for predicting and managing the heat of the electrical circuit unit; and a control/alarm unit for providing control or an alarm to the electrical circuit unit according to the operation of the detection unit, wherein the electrical circuit unit includes one or more thermistors, and the detection unit senses whether or not the electrical circuit unit is abnormally heated.

13 Claims, 4 Drawing Sheets

(56) References Cited

FOREIGN PATENT DOCUMENTS

| | | |
|---|---|---|
| KR | 101824718 | 2/2018 |
| KR | 20190108273 | 9/2019 |
| WO | WO0180268 | 10/2001 |

* cited by examiner

METHOD FOR PREDICTING AND MANAGING TEMPERATURE OF ELECTRONIC CIRCUIT

BACKGROUND

The present invention relates to a method for predicting and managing a temperature of an electronic circuit, and more particularly, to a method for predicting a temperature of an electronic circuit, capable of predicting a result of a temperature increase due to heating in the electronic circuit and components in advance before the heating increases to a dangerous level, and performing warning or blocking control.

All kinds of electrical and electronic components and circuits (hereinafter, collectively referred to "circuits") using electrical energy inevitably generate Joule heating which is proportional to a square value of an electrical current or a voltage.

Heat is generated in the component itself due to the Joule heating generated as described above, causing the temperature around the component to be increased.

The heating due to the Joule heating generated in the circuit as described above (hereinafter referred to as "heating") causes the circuit, which has caused the heating, to operate unstably, and furthermore, excessive overheating may cause the circuit to break down and increase the risk of fire.

As a counteraction against the above-described heating of the circuit, when the heating is detected and the temperature reaches a dangerous set temperature, actions such as notifying a user of this, operating a heat dissipation device capable of cooling heat to remove and cool the generated heat, or cutting off a power supply are generally taken.

In order to operate the above-described protection device, it is important to identify and detect a heating level of the circuit. The heating of the circuit is an inevitable and natural phenomenon according to the Joule heating, and a certain level of heating does not cause much of a problem for the circuit as the heat is radiated to the outside and cools down naturally.

However, when a speed at which the temperature of the circuit increases due to the heating of the circuit is faster than a speed at which the circuit is naturally cooled, the circuit continues to heat up and the temperature rises as the circuit is continuously used, which may eventually cause a problem. Accordingly, it is important to detect whether the heat increases above a certain temperature value (hereinafter, referred to as "rated temperature value") that may cause a failure in the circuit and take action on it, and thus, a conventional general circuit cooling system has a configuration configured to measure a temperature of a heated portion, detect whether the temperature increases above a set rated temperature value, and take action such as operating the heat dissipation device.

However, the related art and the method as described above have a disadvantage that pre-heating of the circuit is not handled in time. Even when the temperature is detected to be greater than or equal to the rated temperature value and an alarm or the like is ringing to a user to wait for a user action, due to the already rising temperature, thermal runaway (electrochemically rapid temperature increase) occurs before the user action is taken, which may cause a circuit failure. In particular, even when actions such as electrically cutting off are taken, electronic components having a large heat capacity in the circuit may store heat therein and continuously emit the heat, causing a continuous increase in the temperature of the circuit, thereby causing a failure in the circuit.

Currently, since only the temperature is simply measured and used without considering the heat capacity of the components in the circuit as described above, the problem caused by overheating of the circuit may not be effectively solved, and thus and a solution therefor is required.

A counteraction or heat dissipation system for heating of the circuit, electronic components, or device has been developed and published in various forms, such as, Korean Patent Registration No. 10-1663532, Korean Patent Registration No. 10-0454114, and Korean Patent Application Publication No. 10-2016-0021960. The above-described registered and published patents are considered to be completely different technologies from the present invention in terms of components and operation methods.

SUMMARY OF THE INVENTION

The present invention is directed to providing a method for predicting and managing a temperature of an electronic circuit, capable of effectively detecting a temperature variation rate, at which a circuit is overheated, to warn in advance, cut off power, or dissipate heat.

In order to achieve the above-described object, according to one aspect of the present invention, there is provided a method for predicting and managing a temperature of an electrical circuit unit including one or more circuits or components using electrical energy, including a detection unit configured to predict and manage heating of the electrical circuit unit, and a control/alarm unit configured to provide control or an alarm for the electrical circuit unit according to an operation of the detection unit, wherein the electrical circuit unit includes one or more thermistors, and the detection unit performs a maximum acceptable voltage setting operation (S1) of setting and storing a maximum acceptable voltage (Vmax) in the electrical circuit unit, a voltage comparison operation (S2) of comparing, by the detection unit, a slope (Vmax_g) of a maximum acceptable voltage (Vmax) and a slope (V_g) of a current voltage between the maximum acceptable voltage (Vmax) and the current voltage input to the electrical circuit unit, and a control and alarm operation (S3) of performing, by the control/alarm unit, control or alarm processing when the slope (V_g) of the current voltage is greater than the slope (Vmax_g) of the maximum acceptable voltage in the operation (S2) to detect a temperature variation rate, so that the temperature is predicted and managed.

In order to compare the slopes (Vmax_g and V_g), the detection unit may divide a voltage section into one or more voltage sections, and measure and compare the slopes at the divided voltage section whenever the voltage reaches the divided voltage section.

The detection unit may include a low pass filter (LPF) part including one or more comparators, resistors, and capacitors, and a detection part connected to an output terminal of the LPF part and including one or more comparators, resistors, and capacitors.

The detection unit may include an LPF part including one or more comparators, resistors, and capacitors, and a microcomputer (Micom) connected to an output terminal of the LPF part.

The Micom may perform an operation (S11) of measuring the maximum acceptable voltage, an operation (S12) of measuring a time (tn) until the maximum acceptable voltage (Vmax) obtained through the operation (S11) converges to a certain value, and obtaining time interval sections (t1 to tn) by dividing the time (tn) by a predetermined time interval (t), and an operation (S13) of preparing and storing the time interval sections (t1 to tn) obtained in operation (S12) and voltage value sections (V_lv_1 to V_lv_n) obtained corresponding to the time interval sections as a table.

According to the present invention, a safety accident such as a fire risk can be prevented in advance by detecting abnormal heating in an electrical circuit before the fire risk occurs due to thermal runaway and ensuring that actions are taken proactively in advance.

DESCRIPTION OF REFERENCE NUMERALS

100: electrical circuit unit, 200: detection unit
300: control/alarm unit

DETAILED DESCRIPTION OF THE INVENTION

Hereinafter, the present invention will be described in more detail with reference to the accompanying drawings. The following description is intended to aid in the understanding and implementing of the present invention and the present invention is not intended to limit the invention. Those skilled in the art will understand that various modifications and changes may be made within the spirit of the present invention as set forth in the following claims.

Figure 1:
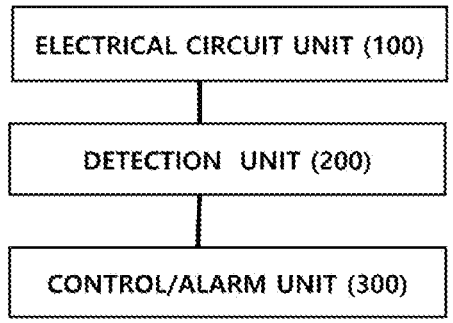
FIG. 1 is a structural diagram of a system to which a method of the present invention is applied.

FIG. 1 is a schematic structural diagram of an electrical device to which a method for predicting and managing a temperature of an electronic circuit of the present invention is applicable. Hereinafter, a schematic configuration of the electrical device to which the method of the present invention is applicable will be described with reference to FIG. 1.

As shown in FIG. 1, the electrical device to which the present invention is applicable includes an electrical circuit unit 100 including one or more electrical circuits, components, and the like operable with electrical energy. The electrical circuit unit 100 may include all kinds of circuits, components, and the like using electrical energy.

In addition, the electrical circuit unit 100 includes one or more thermistors in order to use the method of the present invention.

As described above, as the electrical circuit unit 100 operates, the electrical circuit unit 100 inevitably generates heat, and the electrical device according to the present invention includes a detection unit 200 for predicting and managing the heating of the electrical circuit unit 100 through the method of the present invention.

In addition, the electrical device includes a control/alarm unit 300 configured to perform control such as shutting down the electrical circuit unit 100 based on a detection signal of the electrical circuit unit 100 detected by the detection unit 200, or provide an alarm such as a sound or a screen signal so that the alarm or the screen is externally recognized.

Figure 2:
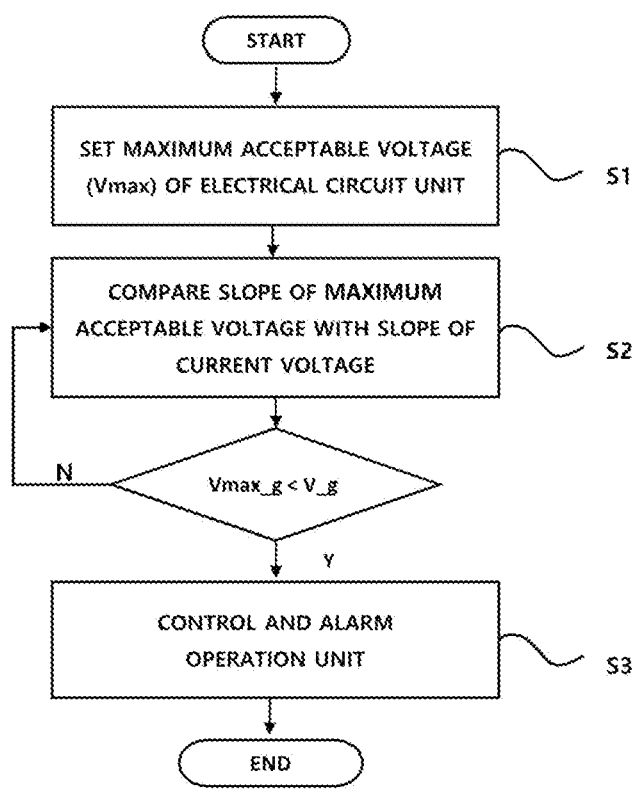
FIG. 2 is a flowchart illustrating the method of the present invention.

FIG. 2 is a flowchart of a method for predicting and managing a temperature of an electronic circuit of the present invention. Hereinafter, the order in which the temperature prediction and management method of the present invention is performed by the electrical device having the form illustrated in FIG. 1 will be described with reference to FIG. 2.

First, maximum acceptable voltage setting operation S1 is performed in which a maximum acceptable voltage Vmax for the thermistor is set according to a temperature increase in the electrical circuit unit 100.

Here, the maximum acceptable voltage Vmax may be a voltage for the entire circuit included in the electrical circuit unit 100, or may be a voltage according to temperatures of one or more specific components included in the electrical circuit unit 100. Hereinafter, as an example, the maximum acceptable voltage is determined as the voltage for the entire circuit of the electrical circuit unit 100 and used.

Figure 3:
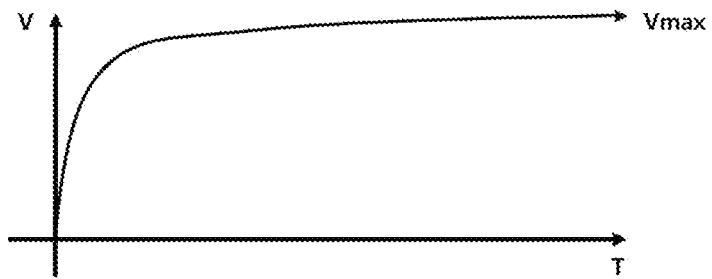
FIGS. 3 to 7 are graphs expressed as the method of the present invention is performed.

A variation rate of the maximum acceptable voltage Vmax means a maximum voltage value at which the electrical circuit unit 100 can operate normally, and values of the maximum acceptable voltage Vmax for the electrical circuit unit 100 can be expressed in the form of a graph as shown in FIG. 3.

Here, as described above, since heating according to Joule heating of the electrical circuit unit 100 is proportional to a voltage, the maximum acceptable voltage Vmax may also be used interchangeably with a maximum acceptable heat generation amount of the electrical circuit unit 100. When a voltage exceeding the maximum acceptable voltage Vmax is applied to the electrical circuit unit 100, it may be predicted that heat more than the electrical circuit unit 100 can handle is generated or will be generated and that abnormality has already occurred or will occur in the electrical circuit unit 100.

Thus, the maximum acceptable voltage Vmax for the electrical circuit unit 100 is obtained in the form as shown in FIG. 3, and maximum acceptable voltage setting operation S1 is performed in which the maximum acceptable voltage is stored in the detection unit 200.

When power is input to the electrical circuit unit 100 after operation S1 is performed, voltage comparison operation S2, in which the detection unit 200 compares the maximum acceptable voltage Vmax measured and stored in operation S1 with a current voltage currently input to the electrical circuit unit 100, is performed.

In the comparing of the maximum acceptable voltage Vmax with the current voltage in operation S2, simply sounding an alarm or performing control when a voltage above the maximum acceptable voltage Vmax is applied is not different from the conventional simple temperature measurement method, and may cause a failure due to a continuous increase in heat due to the heat capacity of the electrical circuit unit 100. Accordingly, it is necessary to predict that the current voltage will exceed the maximum acceptable voltage Vmax, and thus, in operation S2, the prediction method is achieved by comparing a slope Vmax_g of the maximum acceptable voltage Vmax and a slope V_g of the current voltage.

Figure 4:
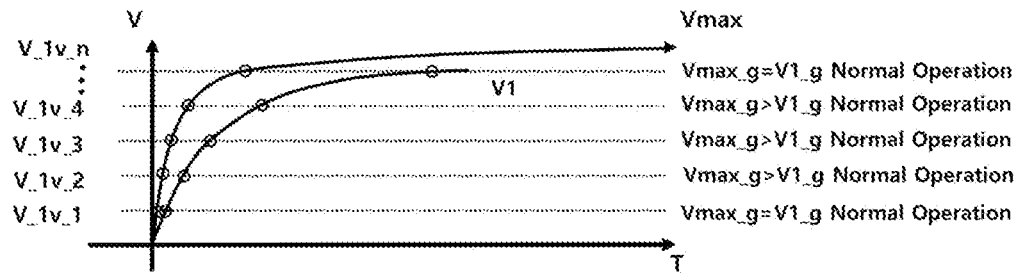

In order to compare the slopes Vmax_g and V_g in operation S2 as described above, the detection unit 200 divides a voltage section into one or more voltage sections as shown in FIG. 4, and whenever the voltage reaches the divided voltage section, a slope in the corresponding section is measured and compared.

Here, the voltage section divided into one or more voltage sections may be theoretically divided into an unlimited number of sections, and in this case, the slope may be measured in real time by measuring a voltage variation rate of each of the maximum acceptable voltage Vmax and the current voltage over time.

FIGS. 4 to 7 are graphs of current voltages V1 to V4 by type in operation S2. Hereinafter, an operation in operation S2 will be described in detail with reference to FIGS. 4 to 7.

Prior to the description, it should be understood that the voltage applied to the electrical circuit unit 100 may actually have various types of voltage variation over time in addition to the types shown in FIGS. 4 to 7, and FIGS. 4 to 7 are illustrated as an example. In operation S2 of the present invention, regardless of the variation type of the voltage applied to the electrical circuit unit 100, a failure may be determined through the above-described slope change.

When a slope value of the current voltage V1 is less than or equal to that of the maximum voltage Vmax in all sections as shown in FIG. 4, it can be determined that the electrical circuit unit 100 operates normally. As described above, in operation S2, in a case in which a voltage section V_lv is divided into n sections V_lv_n (where n is an integer greater than or equal to one), and the slope Vmax_g of the maximum acceptable voltage is compared with a slope V1_g of the current voltage for each section V_lv_1, V_lv_2, V_lv_3, . . . , or V_lv_n, when the slope Vmax_g of the maximum acceptable voltage is always greater than or equal to the slope V1_g of the current voltage, this means that a voltage less than the maximum acceptable voltage is applied to the electrical circuit unit 100, a heating level is within an appropriate range, and the electrical circuit unit 100 is operating normally, so that operation S2 is continued and the detection unit 200 operates until the operation of the electrical circuit unit 100 is completed.

However, when the slope of the current voltage is greater than the slope Vmax_g of the maximum acceptable voltage, this means that the amount of a voltage increase in the electrical circuit unit 100 is greater than the maximum acceptable voltage, which may be interpreted as meaning that the electrical circuit unit 100 is in a dangerous state without being normally operated and has a risk of overheating.

Figure 5:
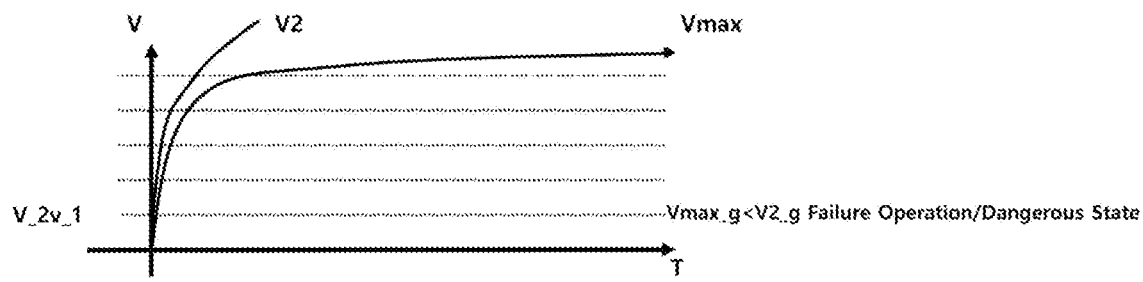

Specifically, as shown in FIG. 5, from a moment when the voltage V2 is applied to the electrical circuit unit 100, the voltage may already increase steeper than the maximum acceptable voltage Vmax. In this case, since the slope V1_g of the current voltage is greater than the slope Vmax_g of the maximum acceptable voltage at the time of the first measurement in the voltage section V_lv_1, it can be determined that the electrical circuit unit 100 is in a dangerous state.

In the form shown in FIG. 5, the electrical circuit unit 100 may appear to be operating normally at the beginning of operation, and thus, with the conventional form of heat detection, the problem may be recognized only after the voltage V2 exceeds the maximum acceptable voltage Vmax, which may result in a larger failure of the electrical circuit unit 100 or a safety accident. On the other hand, according to the method of the present invention, it is possible to take action on the electrical circuit unit 100 safely by determining whether there is a failure through a slope comparison almost simultaneously with the start of an operation.

Figure 6:
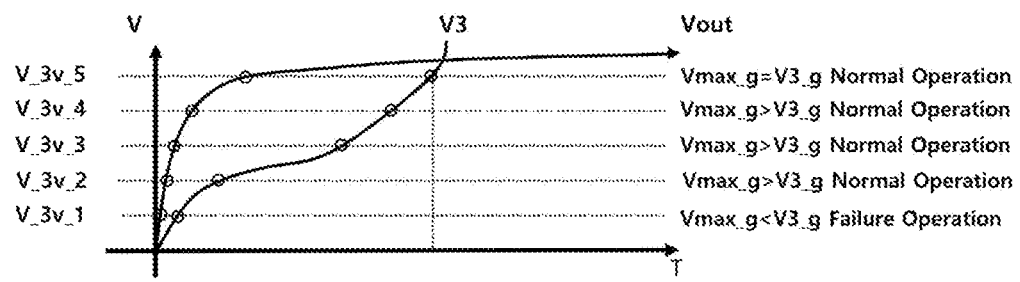
Figure 7:
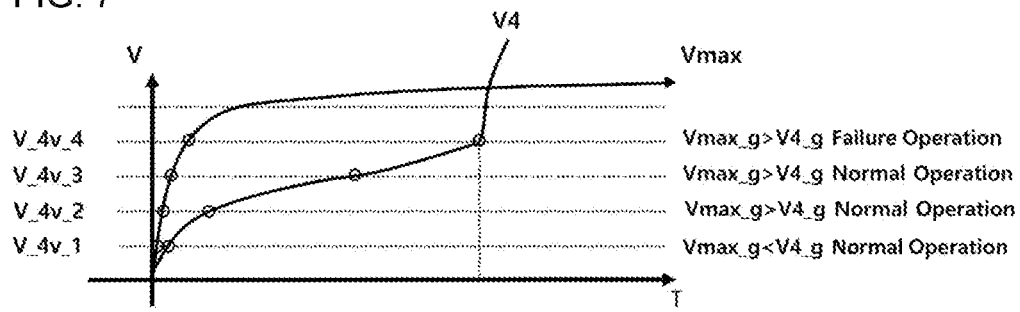

Alternatively, a voltage may be applied to the electrical circuit unit 100 in the voltage form V3 or V4 shown in FIG. 6 or 7, in which the voltage is normally applied to the electrical circuit unit 100, but the voltage increases during operation due to an internal failure or the like of the electrical circuit unit 100. In this case, since a time point at which a failure occurred is a time point at which a voltage increases, that is, the slope V3_g or V4_g of the voltage is greater than the slope Vmax_g of the maximum acceptable voltage, a failure determination may be made by identifying this time point. For example, in FIG. 6, it can be identified that a failure occurs when measured at the section V_lv_5, and in FIG. 7, it can be identified that a failure occurs when measured at the section V_lv_4.

In addition, when a failure is identified in FIGS. 4 to 7, a time T_er at which the failure occurs may be separately measured and used.

When the slope V_g of the current voltage is greater than the slope Vmax_g of the maximum acceptable voltage while operation S2 is performed as described above, the control/alarm unit 300 controls the electrical circuit unit 100 or performs control and alarm operation S3 for notifying to an administrator, and the operations are ended.

In operation S3 described above, the configuration and method of controlling the electrical circuit unit 100 or notifying the administrator by the control/alarm unit 300 may be implemented using methods well known in the art, and thus a detailed description thereof will be omitted.

The detection unit 200 operating as described above may be implemented in various forms, and the configuration and operation form of the detection unit 200 will be described below with two examples of the detection unit.

Figure 8:
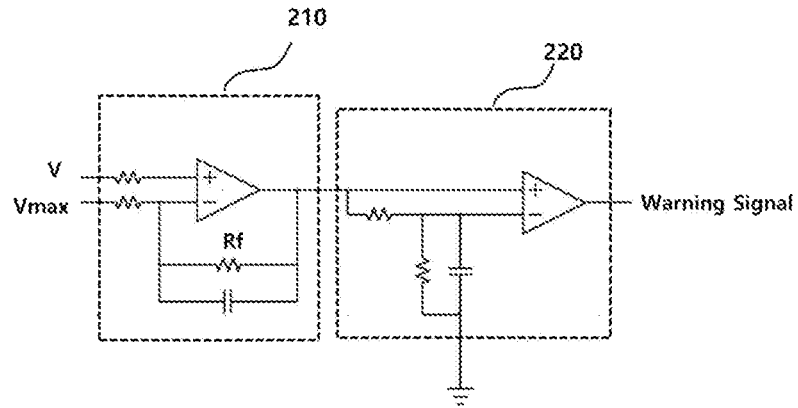
FIG. 8 is a circuit structural diagram of a first example of a detection unit of the present invention.

FIG. 8 is a circuit diagram of a first example of the detection unit 200. Hereinafter, a first example of a configuration and operation of the detection unit 200 will be described with reference to FIG. 8.

The first example of the detection unit 200 includes only electrical circuit, specifically a low pass filter (LPF) part 210 including one or more comparators, resistors, and capacitors, and a detection part 220 connected to an output terminal of the LPF part 210 and including one or more comparators, resistors, and capacitors.

As shown in FIG. 8, in the LPF part 210, an input V according to the current operation of the electrical circuit unit 100 is applied to a + input terminal of the comparator, and the maximum acceptable voltage Vmax, which is voltage obtained after measuring a voltage value according to the environmental temperature and can be maximally accepted by the electrical circuit unit 100, is applied to – input terminal of the comparator. In the above-described state, by adding an integrator circuit and a feedback resistor Rf to the – input terminal of the comparator, the LPF part 210 functions as a low pass filter having a gain in a low frequency band Due to the above-described operation of the LPF part 210, when the current state is in a normal operating state in which the current voltage V is less than the maximum acceptable voltage Vmax, no voltage is applied to the output terminal of the comparator, and the detection part 220 at the rear stage will not operate.

In addition, since the generation of a voltage at the output terminal of the LPF part 210 means that the current voltage V is greater than the maximum acceptable voltage Vmax, it is necessary to determine whether the electrical circuit unit 100 is in an abnormal state through the detection part 220.

The output terminal of the LPF part 210 is connected to a + input terminal of the comparator of the detection part 220, and an integrator set for an input terminal is connected to the − input terminal of the comparator of the detection part 220 to perform a time integration on the voltage output from the output terminal of the LPF part 210. Here, a high signal is output only when a change in data input through the maximum acceptable voltage Vmax is greater than a certain level in a + direction, and when the current voltage of the output terminal of the LPF part 210 is greater than a value obtained by time integrating the voltage of the output terminal, it is determined that the electrical circuit unit 100 is in an abnormal state and operation S3 is performed.

In the first example of the detection unit 200 as shown in FIG. 8, voltage comparison is performed and operated in real time.

Figure 9:
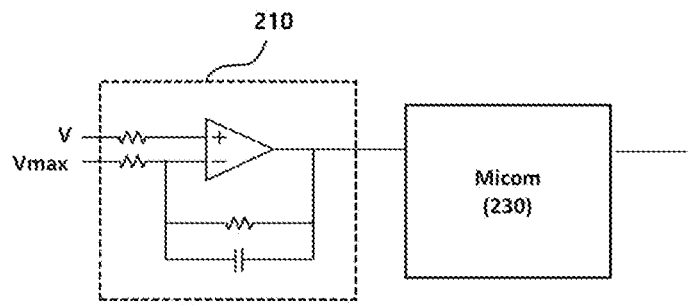
FIG. 9 is a circuit structural diagram of a second example of the detection unit of the present invention.

FIG. 9 is a circuit diagram of a second example of the detection unit 200. Hereinafter, a second example of the configuration and operation of the detection unit 200 will be described with reference to FIG. 9.

As shown in FIG. 9, the second example of the detection unit 200 includes the same LPF part 210 as the first example. Accordingly, the configuration and operation of the LPF part 210 are the same as those described above, and thus a description thereof will be omitted.

Figure 10:
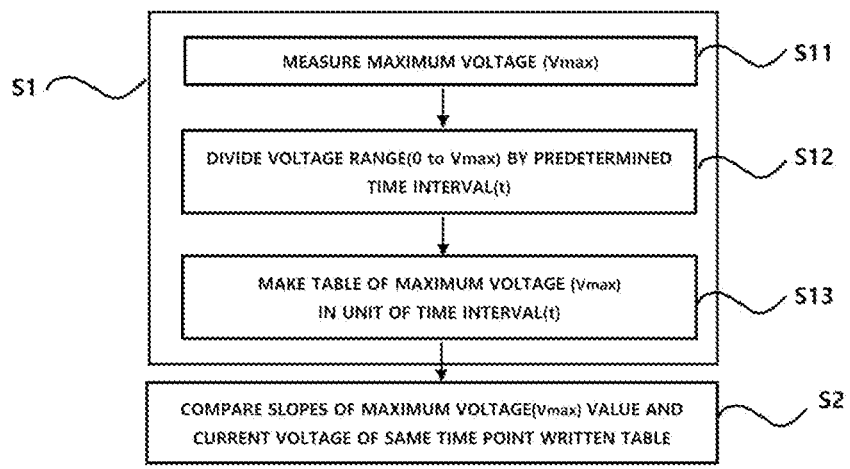
FIG. 10 is a flowchart illustrating operations additionally performed in the second example of the detection unit of the present invention.
Figure 11:
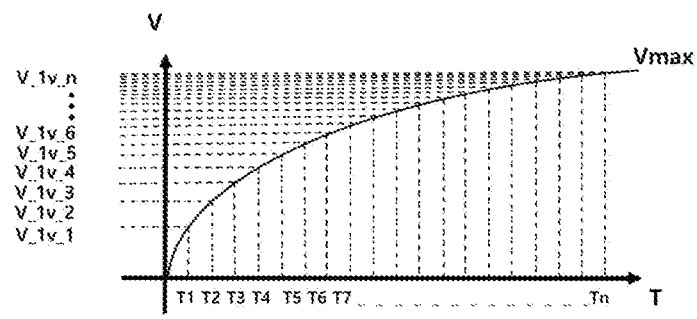
FIG. 11 is a graph according to the second example of the detection unit of the present invention.

In addition, an output terminal of the LPF part 210 is connected to a microcomputer (Micom) 230. The Micom 230 serves to substantially detect a failure, and an operation of the Micom 230 is shown in FIGS. 10 and 11. FIG. 10 is a flowchart illustrating the operation of the Micom 230, and FIG. 11 is a graph depicting the results of the operation of the Micom 230.

Prior to the description, the flowchart in FIG. 10 is a further illustration of a portion of the flowchart in FIG. 2, operations S11 to S13 of the flowchart in FIG. 10 are included in operation S1 of the flowchart in FIG. 2, and operation of the flowchart in FIG. 10 is included in operation S2 of the flowchart in FIG. 2.

As shown in FIG. 10, the Micom 230 should be set for measuring the operation of the electrical circuit unit 100, and the maximum acceptable voltage Vmax of the electrical circuit unit 100 inevitably varies for each device. Thus, after performing operation S11 to measure the maximum acceptable voltage Vmax, it is necessary to determine a measurement interval for comparing the maximum acceptable voltage Vmax and the current voltage V. Here, the maximum acceptable voltage Vmax is obtained through operation S11, and in general, the maximum acceptable voltage Vmax has a graph form as shown in FIG. 11, which converges to the certain value $V\_lv\_n$. Accordingly, operation S12 is performed in which a time tn until the maximum acceptable voltage Vmax converges to a certain value is measured, and the time tn for which the maximum acceptable voltage Vmax reaches the value $V\_lv\_n$ from 0 is divided by a predetermined time interval t.

Through operation S12, predetermined time interval sections t1 to tn and voltage value sections $V\_lv\_1$ to $V\_lv\_n$ corresponding to the time intervals are obtained.

In the above, the time interval t may be, for example, in units of one second, or in units of 10 seconds. Thus, when the time Tn at which the maximum acceptable voltage Vmax reaches a predetermined value is one minute, there will be 60-time intervals when one minute is divided in units of one second.

Operation S13 is performed in which the time interval sections t1 to tn divided in operation S12 and the voltage value sections $V\_lv\_1$ to $V\_lv\_n$ obtained correspondingly are prepared as a table and stored.

A voltage value in the specific voltage section, the time interval section corresponding to the voltage section, and a slope value of the voltage value are stored according to operation S13.

For example, according to the graph shown in FIG. 11, a voltage value $V\_lv\_2$, a time value t2 corresponding to the voltage value, and a slope value of the voltage value $V\_lv\_2$ are stored.

The voltage value sections $V\_lv\_1$ to $V\_lv\_n$ may be obtained as described above, and then operation S2 may be performed accordingly.

The invention claimed is:

1. A method for predicting and managing a temperature of an electrical circuit unit including one or more circuits or components using electrical energy, comprising:
   performing a maximum acceptable voltage setting operation (S1) of setting and storing a maximum acceptable voltage (Vmax) in the electrical circuit unit using a detection unit, wherein the detection unit is configured to predict and manage heating of the electrical circuit unit, wherein the electrical circuit unit includes one or more thermistors;
   predicting that the current voltage will exceed the maximum acceptable voltage (Vmax) before the current voltage reaches the maximum acceptable voltage (Vmax) by performing a voltage comparison operation (S2) by the detection unit by comparing a slope (Vmax_g) of a maximum acceptable voltage (Vmax) with a slope (V_g) of a current voltage between the maximum acceptable voltage (Vmax) and the current voltage input to the electrical circuit unit; and
   performing one of a control or alarm operation (S3) or both a control and alarm operation when the slope (V_g) of the current voltage is greater than the slope (Vmax_g) of the maximum acceptable voltage (Vmax) in the operation (S2).

2. The method of claim 1, wherein, in order to compare the slopes (Vmax_g and V_g), operating the detection unit to divide a voltage section into one or more voltage sections, and measure and compare the slopes at the divided voltage section whenever the voltage reaches the divided voltage section.

3. The method of claim 1, wherein the detection unit includes a low pass filter (LPF) part including one or more comparators, resistors, and capacitors, and a detection part connected to an output terminal of the LPF part and including one or more comparators, resistors, and capacitors.

4. The method of claim 1, wherein the detection unit includes an LPF part including one or more comparators, resistors, and capacitors, and a microcomputer (Micom) connected to an output terminal of the LPF part.

5. The method of claim 4, wherein the Micom performs:
   an operation (S11) of measuring the maximum acceptable voltage;
   an operation (S12) of measuring a time (tn) until the maximum acceptable voltage (Vmax) obtained through the operation (S11) converges to a certain value, and obtaining time interval sections (t1 to tn) by dividing the time (tn) by a predetermined time interval (t); and
   an operation (S13) of preparing and storing the time interval sections (t1 to tn) obtained in operation (S12) and voltage value sections ($V\_lv\_1$ to $V\_lv\_n$) obtained corresponding to the time interval sections as a table.

6. A method for predicting and managing a temperature of an electrical circuit unit including one or more circuits or components using electrical energy, comprising:
  performing a maximum acceptable voltage setting operation (S1) of setting and storing a maximum acceptable voltage (Vmax) in the electrical circuit unit using a detection unit, wherein the detection unit is configured to predict and manage heating of the electrical circuit unit, wherein the electrical circuit unit includes one or more thermistors; and
  performing a voltage comparison operation (S2) by the detection unit by comparing a slope (Vmax_g) of a maximum acceptable voltage (Vmax) and a slope (V_g) of a current voltage between the maximum acceptable voltage (Vmax) and the current voltage input to the electrical circuit unit, wherein comparing the slopes (Vmax_g and V_g) incudes, by the detection unit, dividing a voltage section into one or more voltage sections, and measuring and comparing the slopes at the divided voltage section whenever the voltage reaches the divided voltage section.

7. The method of claim 6, wherein the detection unit includes a low pass filter (LPF) part including one or more comparators, resistors, and capacitors, and a detection part connected to an output terminal of the LPF part and including one or more comparators, resistors, and capacitors.

8. The method of claim 6, wherein the detection unit includes an LPF part including one or more comparators, resistors, and capacitors, and a microcomputer (Micom) connected to an output terminal of the LPF part.

9. The method of claim 8, wherein the Micom performs:
  an operation (S11) of measuring the maximum acceptable voltage;
  an operation (S12) of measuring a time (tn) until the maximum acceptable voltage (Vmax) obtained through the operation (S11) converges to a certain value, and obtaining time interval sections (t1 to tn) by dividing the time (tn) by a predetermined time interval (t); and
  an operation (S13) of preparing and storing the time interval sections (t1 to tn) obtained in operation (S12) and voltage value sections (V_lv_1 to V_lv_n) obtained corresponding to the time interval sections as a table.

10. A method for predicting and managing a temperature of an electrical circuit unit including one or more circuits or components using electrical energy, comprising:
  performing a maximum acceptable voltage setting operation (S1) of setting and storing a maximum acceptable voltage (Vmax) in the electrical circuit unit using a detection unit, wherein the detection unit is configured to predict and manage heating of the electrical circuit unit, wherein the electrical circuit unit includes one or more thermistors;
  performing a voltage comparison operation (S2) by the detection unit by comparing a slope (Vmax_g) of a maximum acceptable voltage (Vmax) and a slope (V_g) of a current voltage between the maximum acceptable voltage (Vmax) and the current voltage input to the electrical circuit unit, wherein comparing the slopes (Vmax_g and V_g) incudes, by the detection unit, dividing a voltage section into one or more voltage sections, and measuring and comparing the slopes at the divided voltage section whenever the voltage reaches the divided voltage section; and
  performing one of a control or alarm operation (S3) or both a control and alarm operation when the slope (V_g) of the current voltage is greater than the slope (Vmax_g) of the maximum acceptable voltage (Vmax) in the operation (S2).

11. The method of claim 10, wherein the detection unit includes a low pass filter (LPF) part including one or more comparators, resistors, and capacitors, and a detection part connected to an output terminal of the LPF part and including one or more comparators, resistors, and capacitors.

12. The method of claim 10, wherein the detection unit includes an LPF part including one or more comparators, resistors, and capacitors, and a microcomputer (Micom) connected to an output terminal of the LPF part.

13. The method of claim 12, wherein the Micom performs:
  an operation (S11) of measuring the maximum acceptable voltage;
  an operation (S12) of measuring a time (tn) until the maximum acceptable voltage (Vmax) obtained through the operation (S11) converges to a certain value, and obtaining time interval sections (t1 to tn) by dividing the time (tn) by a predetermined time interval (t); and
  an operation (S13) of preparing and storing the time interval sections (t1 to tn) obtained in operation (S12) and voltage value sections (V_lv_1 to V_lv_n) obtained corresponding to the time interval sections as a table.

* * * * *